United States Patent [19]
Lin et al.

[11] Patent Number: 5,243,234
[45] Date of Patent: Sep. 7, 1993

[54] DUAL GATE LDMOSFET DEVICE FOR REDUCING ON STATE RESISTANCE

[75] Inventors: Ming-Zen Lin; Kun-Zen Chang, both of Hsinchu; Jyh-Chyurn Guo, Tainan, all of Taiwan

[73] Assignee: Industrial Technology Research Institute, Taiwan

[21] Appl. No.: 673,973

[22] Filed: Mar. 20, 1991

[51] Int. Cl.⁵ .................. H03K 17/08; H03K 17/14; H03K 17/687; H01L 29/784
[52] U.S. Cl. .................................. 307/304; 257/328; 257/339; 257/342; 307/571; 307/573; 307/585
[58] Field of Search ............... 307/511, 572, 573, 579, 307/585, 304; 257/328, 339, 342

[56] References Cited
U.S. PATENT DOCUMENTS

| | | | |
|---|---|---|---|
| 4,300,150 | 11/1981 | Colak | 257/339 |
| 4,366,495 | 12/1982 | Goodman et al. | 257/342 |
| 4,642,666 | 2/1987 | Lidow et al. | 257/342 |
| 4,942,440 | 7/1990 | Baliga et al. | 307/571 |
| 4,952,991 | 8/1990 | Kayama | 257/342 |

Primary Examiner—John Zazworsky
Attorney, Agent, or Firm—Darby & Darby

[57] ABSTRACT

A double polysilicon dual gate LDMOSFET structure combined with a detecting circuit can be used to reduce the ON state resistance and without degradation of the breakdown voltage of the LDMOSFET. In the ON state, a drift region is driven into accumulation. In the OFF state, a gate is made to float and thereby avoid degradation of the breakdown voltage. A switch or transistor is modulated to either allow applied voltage to bias the gate for enabling the drift region to be driven into accumulation or to cause the gate to float to prevent the driving of the drift region by the voltage.

13 Claims, 4 Drawing Sheets

DUAL GATE LDMOSFET DEVICE FOR REDUCING ON STATE RESISTANCE

BACKGROUND OF THE INVENTION

1. Field of the Invention

The present invention relates to a design of a dual gate LDMOSFET device which reduces ON state resistance and avoids degradation of breakdown voltage and has application to a power integrated circuit.

2. Discussion of Related Art

A double polysilicon (double poly-si) process for fabricating CMOS integrated circuits is well known. For instance, a double poly-si process is described in U.S. Pat. No. 4,517,731, whose contents are incorporated herein by reference.

The conventional design of a lateral double-diffused metal oxide semiconductor field effect transistor (LDMOSFET) requires making a tradeoff between the ON state resistance and the breakdown voltage. A modified design by Serag E.-D. Habib, U.K. patent 2,150,746A, Jul. 3, 1985, has made it possible to obtain both low ON state resistance and high breakdown voltage at the same time. This was achieved by using a semi-insulating poly-Si (SIPOS) layer over the oxide covering drift region. In the ON state, the potential distributed along the SIPOS can bias the drift region into an accumulation region, which greatly reduces the ON state resistance. The ON state resistance was shown to be able to decrease by a factor of 2-4. This accumulation region may be at a surface of the drift region.

In the OFF state, the SIPOS layer has no detrimental effect on the breakdown voltage. The drawback of this design is that the decrease of the ON state resistance is not maximized since the potential distribution along the SIPOS layer is set by the applied drain voltage and may not be changed easily.

It would, therefore, be desireable to provide a circuit which maximizes the decrease of the ON resistance and yet avoids degradation of breakdown voltage.

SUMMARY OF THE INVENTION

The present invention is directed to a dual gate device for varying the ON state resistance and breakdown voltage independently of each other. This is realized by using a double poly-Si gate process and a detecting circuit, which detects the state in which a LDMOSFET is working.

When an ON state is detected, the detecting circuit enables the application of a voltage on the drift region controlling gate to drive the drift region into accumulation. Consequently, the ON state resistance may be minimized independently by modulating the applying voltage accordingly.

When the OFF state is detected, the detecting circuit will make the drift region controlling gate float, which makes a dual gate device act like a conventional single gate device so that the breakdown voltage remains unaltered and not degraded. By using these techniques, both ON state resistance and breakdown voltage may be optimized independently of each other.

BRIEF DESCRIPTION OF THE DRAWINGS

For a better understanding of the present invention, reference is made to the following description and accompanying drawings, while the scope of the invention is set forth in the appended claims.

DESCRIPTION OF THE PREFERRED EMBODIMENT

Figure 1:
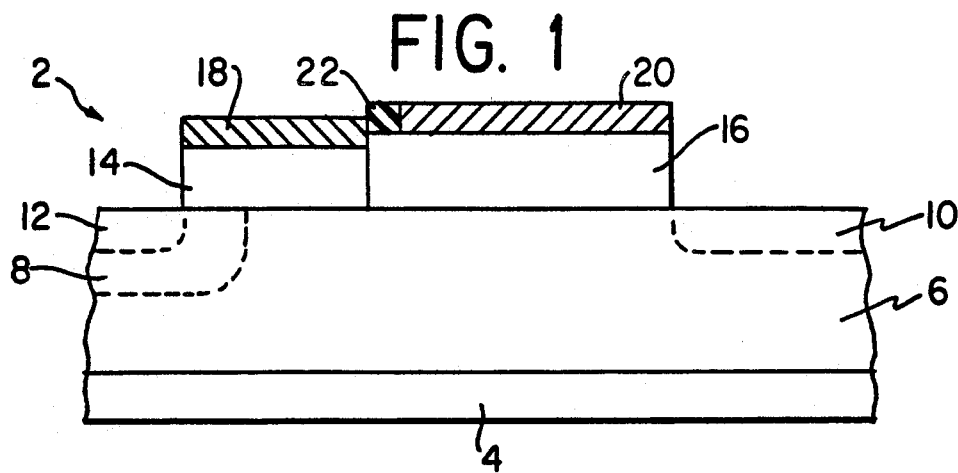
FIG. 1 shows a schematic view of a transistor in accordance with the present invention.

FIG. 1 shows a lateral, double diffused, metal oxide semiconductor type field effect transistor (LDMOSFET) 2. This transistor has a substrate 4 on which is arranged a drift region 6. Spaced from each other and from the substrate 4 at opposite sides of the drift region 6 is a body region 8 on one side an a drain region 10 on the other side. The body region 8 is also between a source region 12 and the drift region 6.

The drain region 10 and source region 12 are made of semiconductor material type I (N or P) and are heavily doped. The drift region 6 is made of the same type but is lightly doped. The body region 8 is made of semiconductor material type II (P or N), which is opposite in conductivity type to the type I. The substrate region 4 is made of type II but is lightly doped.

Both the gate insulators 14 and 16 are made generally of $SiO_2$ and each has a thickness which may be the same or different from each other. The extent to which the drift region controlling gate 20 covers the drift region 6 determines the breakdown voltage. Thus, the longer the gate 20 overlies drift region 6, the higher the breakdown voltage.

A gate electrode region or gate 18 is provided as a region made from poly-Si to cover all of the first gate insulator 14. A drift region controlling gate 20 is produced as another region made from poly-Si to cover most of the second gate insulator 16. Depending on the process sequence, an insulator layer 22, which may be poly-oxide and grown from either gate 18 or 20, is between gates 18 and 20 and covers the remaining portion of the gate insulator 16. This insulator layer 22 must be thick enough to withstand a voltage Vdd1 (see FIG. 3) which is applied between gates 18 and 20.

Figure 9:
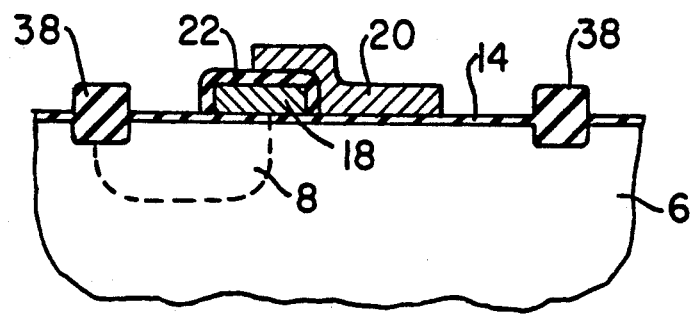

Further, the gate 18 may be patterned to partially overlap gate 20 or vice versa (see FIG. 9). With the poly-Si drift region controlling gate 20, the potential of the drift region is more freely controlled. Therefore, the ON state resistance may be controlled to be minimum by modulating the voltage of the poly-Si drift region controlling gate 20.

The gate 18 and first gate insulator 14 constitute a unitary element and covers all of the upper surface of the body region 8. It covers part of the upper surface of the drift region 6 to ensure that under fabrication process variations, it overlies all of the upper surface of the body region 8 to ensure transistor action. It also covers part of the upper surface of the source region 12, which coverage is unavoidable. During formation, the source region 12 experiences undesired horizontal lateral growth under the first gate insulator 14 by about 80% of the vertical diffusion length of the source region 12.

The drift controlling gate 20 and second gate insulator 16 constitute a unitary element which covers the remaining portion of the drift region 6. Some coverage of the drain region 10 may occur for the same reason that the source region 12 grows by lateral diffusion under the gate insulator 14. However, in both cases, the extent of coverage over the source or drain regions is too small to cause any appreciable degradation of the performance of the transistor 2.

Figure 2:
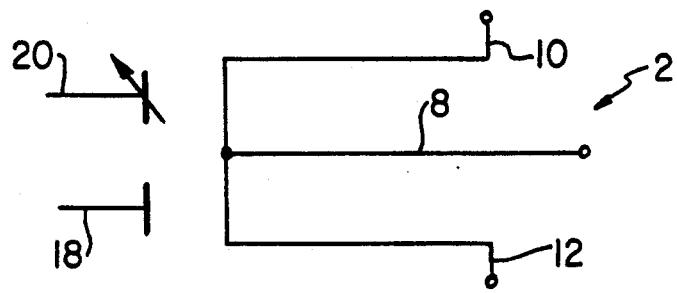
FIG. 2 shows a symbolic representation of the transistor of FIG. 1.

FIG. 1 may be represented by a conventional NMOSFET symbol, except that there is added a drift region controlling gate 20 as shown in FIG. 2. FIG. 2, therefore, constitutes a symbolic representation of the LDMOSET 2 of the present invention. This LDMOSFET may constitute an N channel MOSFET (PMOSFET) 24.

Figure 3:
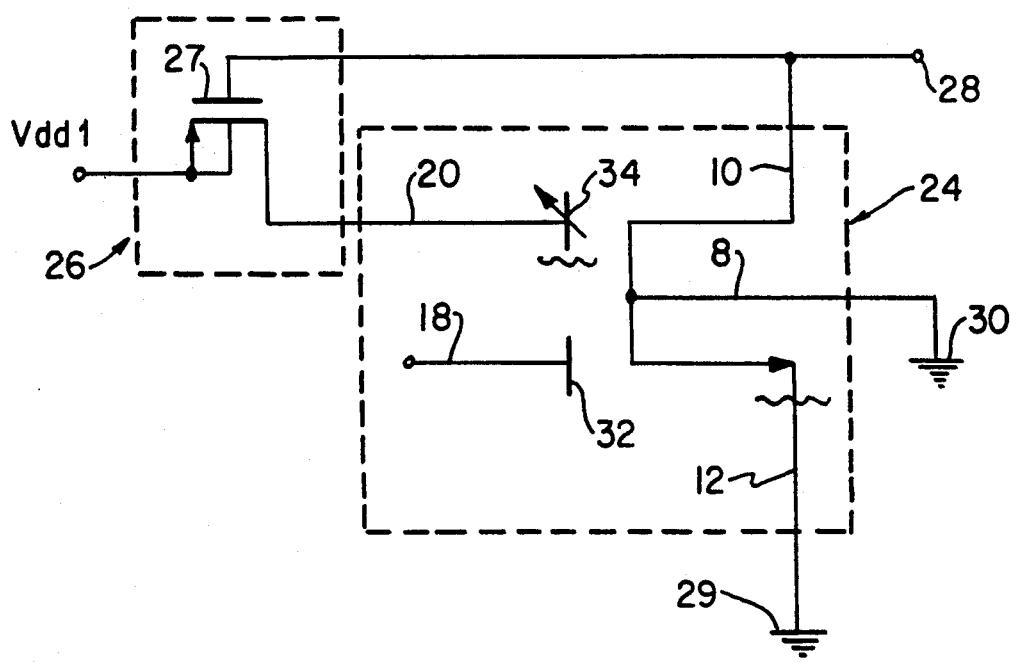
FIG. 3 shows a schematic circuit diagram of a preferred embodiment of the detecting circuit in accordance with the present invention.

FIG. 3 shows a detecting circuit design of a switching device for which the P channel MOSFET (PMOSFET) 26 acts as the detector of whether the condition of the N channel MOSFET (NMOSFET) 24 is in an ON state or OFF state. An internally generated voltage Vdd1 is generated on the chip to bias the source of NMOSFET 24. The NMOSFET 24 terminates the source region 12 with a node 29, the drain region 10 with a node 28 that is not grounded, and the body region 8 with a node 30. Nodes 29 and 30 are grounded. Gate 18 has one end with terminal for applying a control voltage to the other end which has a gate node 32. It should be appreciated that transistors 24 and 26 may be considered to be switches, which switch either on or off.

The NMOSFET 24 turns on in response to the gate node 32 being applied with a logic high state "1" voltage and turns off in response to the gate node 32 being applied with a logic low state "0" voltage. The PMOSFET 26 is turned on when the gate node 32 is applied with a logic high state "1" voltage and is turned off in response to the gate node 32 being applied with a logic low state "0" voltage.

When the gate node 32 is applied with a high state "1" voltage, the NMOSFET 24 is in an ON state and, at the same time, the node 28 voltage is dropping. This dropping voltage turns on the PMOSFET 26 (via gate 27) so that the gate node 34 (which corresponds to the drift region controlling gate 20) biases to Vdd1. This allows the drift region 6 to be modulated and driven into accumulation for increasing the current flow and decreasing the ON resistance.

When the node 32 is applied with a low state "0" voltage, the NMOSFET 24 is in an OFF state and, at the same time, the node 28 voltage is rising. This rising voltage turns off the PMOSFET 26 (via gate 27) so that the gate node 34 (which corresponds to the drift region controlling gate 20) is made to float. This makes the breakdown voltage of the NMOSFET 24 same as would be the case if there is no gate 20 present.

Further, the minimizing of the ON state resistance in accordance with the invention is out of the Vdd1, which may be set and generated arbitrarily. In addition, from simulation, the ON resistance may be reduced by a factor of 5~10.

If the drift region controlling gate 20 were to float in the ON state (rather than in the OFF state) of the transistors 24 and 26, the ON resistance would be the same as if there were no drift region controlling gate 20. If the drift region controlling gate 20 were to bias for the OFF state of the transistors 24 and 26, then the breakdown voltage would decrease. Therefore, it is preferred that the drift region controlling gate 20 float for the OFF state and bias for the ON state so as to maintain the breakdown voltage at the same level and to minimize the ON state resistance.

FIGS. 4–11 depict progressive fabrication schematic diagrams of the LDMOSFET according to a first embodiment of the invention. FIG. 12 depicts a fabrication schematic diagram according to a second embodiment of the invention which replaces FIG. 10. FIGS. 4–8 and 13–15 depict progressive fabrication schematic diagrams of the LDMOSFET according to a third embodiment of the invention.

Figure 4:
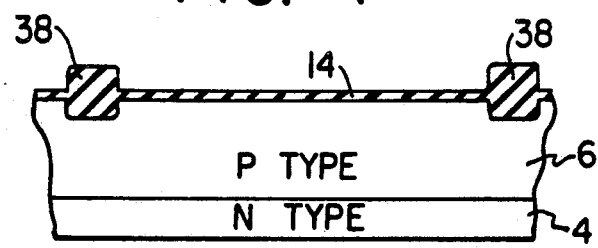
FIGS. 4–11 show cross-sections illustrating progressive fabrication views of a first embodiment of the transistor of FIG. 1.
Figure 5:
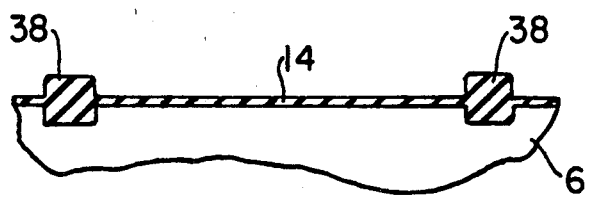
Figure 6:
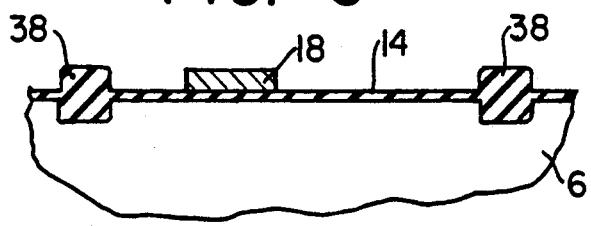
Figure 7:
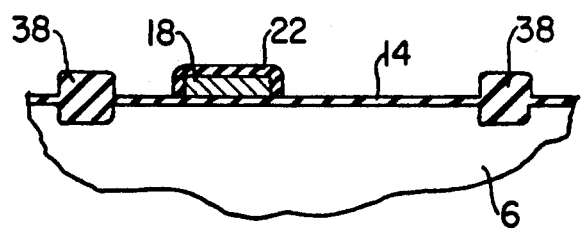
Figure 8:
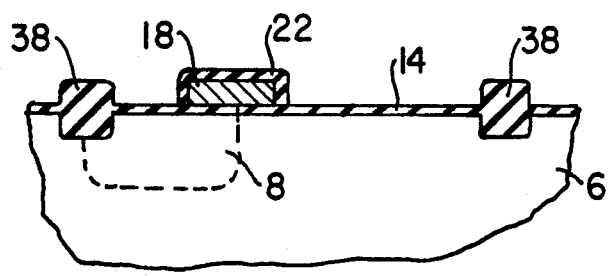

FIG. 4 represents isolation formation of drift region 6 and substrate region 4 in order to isolate devices. FIG. 5 represents gate oxidation to form the first gate insulator 14 between two field oxide regions 38, which electrically isolate the active regions in which the n-channel and p-channel transistors of the MOS device will be formed from the surrounding active and passive devices. FIG. 6 provides for poly-silicon I formation to comprise gate electrode 18. FIG. 7 results in poly-silicon oxidation to form the second gate insulation 22 which is used to isolate poly-silicon I from poly-silicon II. FIG. 8 shows the implantation and driving in of body region 8.

Figure 10:
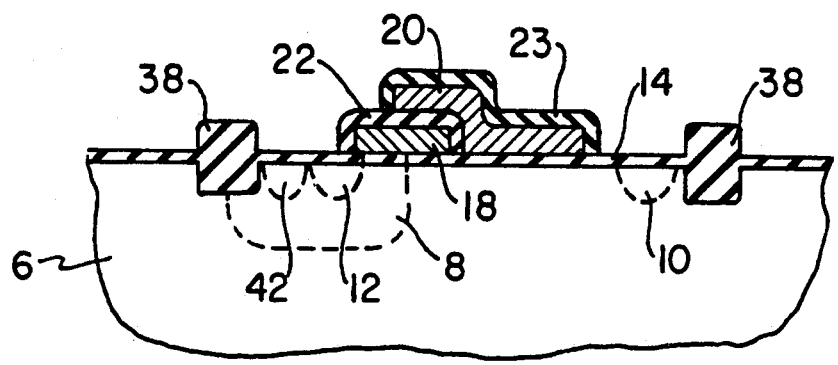
Figure 13:
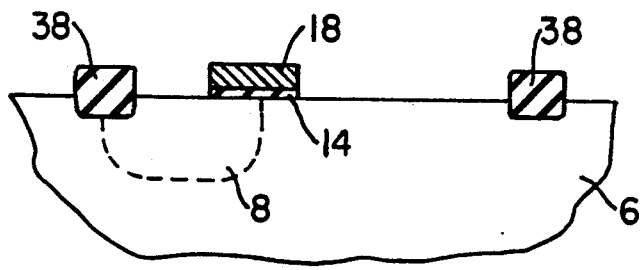
FIGS. 13–15 show cross-sections of progressive fabrications views of a third embodiment of the transistor of FIG. 1 but which replaces FIGS. 9 and 10 in the sequence of fabrication steps of the first embodiment.
Figure 14:
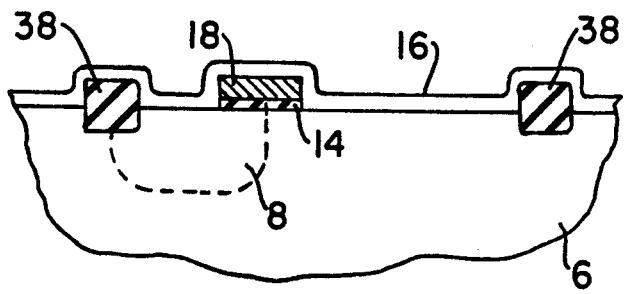
Figure 15:
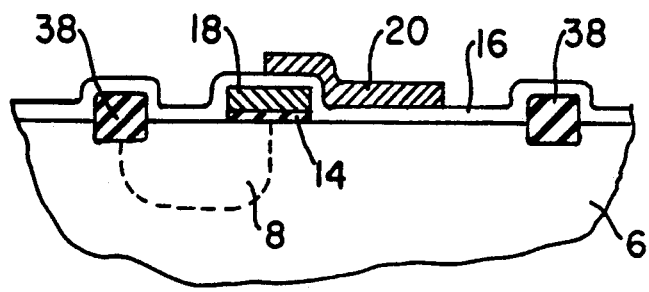

At this stage, the thicknesses of gate insulators 14 and 16 may be made to be either equal to each other in accordance with FIGS. 9 and 10 or else not equal to each other in accordance with FIGS. 13–15.

FIG. 9 provides for poly-silicon II formation to comprise the drift region controlling gate 20. FIG. 10 shows the result after adding an insulator 23 to cover the gate electrode 20 for protecting gate electrode 20 from the subsequent source and drain implant and after providing source and drain implantation (regions 10 and 12) and after providing implantation region 42, which serves as a contact for the body region 8.

Typically, body region 8 may be p-type, source and drain regions 12 and 10 may be n type, in which case implantation region 42 is p+ type to serve as a contact for the p well of body region 8. In other words, the doping type of the implantation region 42 is opposite to that of the drain region 10.

Figure 11:
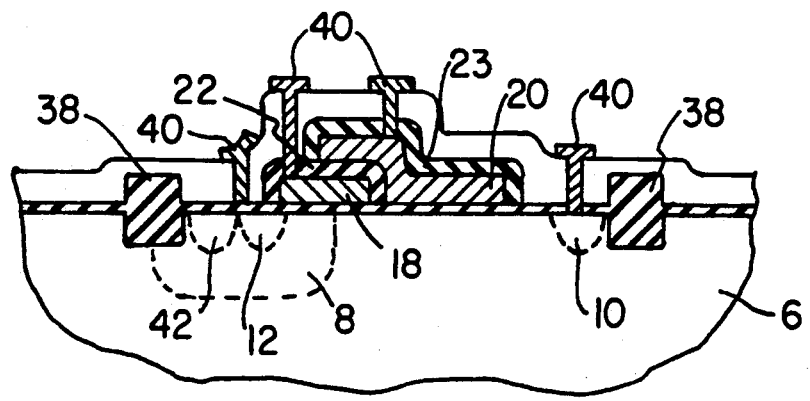
Figure 12:
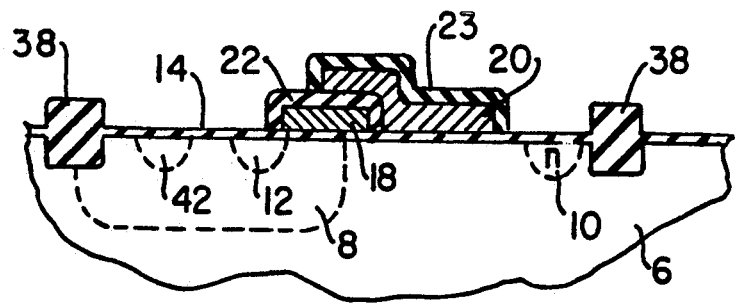
FIG. 12 shows a cross-section illustrating a fabrication view which replaces FIG. 10 in accordance with a second embodiment.

FIG. 11 shows the addition of aluminum metallization 40 to connect the source region 12, drain region 10, gate electrode 18 and gate electrode 20 to the outside through the metallization. As an alternative to the implantation step which results in FIG. 10, FIG. 12 shows the result if the implantation region 42 is formed separated from the source region 12, rather than formed adjacent to the source region 12 as in FIG. 10.

FIGS. 13–15 show the result after blankly etching the upper surface of regions 14 and 18 and then depositing an SiO$_2$ layer 16 as shown in FIG. 14. FIG. 15 shows poly-silicon II formation to comprise electrode gate 20. This result enables the thickness of the gate insulator 16 to be changed and thereby differ from the thickness of the insulation layer 14 in contrast to the result produced by obtaining the construction shown in FIG. 9.

Although not depicted for the embodiment of FIGS. 4–8 and 13–15, it should be appreciated that the same steps required to obtain the constructions depicted in FIGS. 10–11 or 12 may be applied to the embodiment of FIGS. 4–8 and 13–15 after step 15 has been completed. The regions affected are the same as those shown when changing the FIG. 9 construction into that shown in FIGS. 10-11 or 12.

Where insulation layers are in contact with each other, they may be of a unitary structure although it is preferred that they be separate to form a unitary structure with the associated gate which they insulate.

The NMOSFET 24 may be replaced a p type MOSFET as long as the PMOSFET 26 were replaced by an n type MOSFET. A change in the conductivity of the transistors 24, 26 forms a complementary device which only requires a change in the polarity of the terminals of the devices.

The invention has application to any type of switch or transistor that has a drift region which may be driven into accumulation in response to application of a voltage, which application is allowed or prevented by modulating another switch or transistor.

While the foregoing description and drawings represent the preferred embodiment of the present invention, it will be understood that various changes and modifications may be made without departing from the spirit and scope of the present invention.

What is claimed is:

1. An apparatus for changing an ON state resistance of a transistor independently and free of degrading a breakdown voltage of the transistor, comprising:
   a transistor having a drift region; and
   switch means for detecting an ON state and an OFF state of said transistor, said switch means being responsive to detecting said ON state for applying and modulating a biasing voltage to drive said drift region into accumulation and being responsive to detecting said OFF state for preventing said biasing voltage from driving said drift region into accumulation.

2. An apparatus as in claim 1, wherein said switch means includes another transistor which enters into an ON state in response to said first-mentioned transistor entering into said ON state and which enters into an OFF state in response to said first-mentioned transistor entering into said OFF state.

3. An apparatus as in claim 1, wherein said transistor has a drift region controlling gate and has means for applying a control voltage to said transistor, said transistor having a drain which produces a rising voltage in response to said transistor entering into said OFF state and produces a falling voltage in response to said transistor entering into said ON state, said switch means responding to said rising and falling voltage for causing said gate to respectively float and bias, said drift region of said transistor being arranged for driving into said accumulation in response to said gate biasing to said biasing voltage, said drift region being arranged for refraining from driving into said accumulation in response to said gate floating.

4. An apparatus as in claim 1, wherein said transistor comprises:
   a substrate;
   a drift region on said substrate;
   a first gate overlying a respective portion of an upper surface of said drift region;
   a second gate overlying a remaining portion of said upper surface of said drift region so as to determine an amount of said accumulation attainable;
   a first insulation layer arranged between said first and second gates;
   source, body and drain regions, said body region being arranged between said source region and said drift region, said first gate overlying said body region, said drift region being between said body and drain regions; and
   a second insulation layer arranged between said drift region and said gates.

5. An apparatus as in claim 4, wherein said transistor enters into said ON state in response to a control voltage being applied via said first gate and enters into said OFF state when there is no control voltage being applied, said second gate being a drift region controlling gate which causes said drift region to drive to accumulation when said second gate biases to a biasing voltage and the transistor is in said ON state.

6. An apparatus as in claim 5, wherein said drift region controlling gate is made of poly-si.

7. An apparatus as in claim 4, wherein a portion of said second gate overlies a portion of said first gate.

8. An apparatus as in claim 4, wherein said insulation layer has a first insulation portion extending between said first gate and said drift region and a second insulation portion extending between said second gate and said drift region, said first and second insulation portions being of a different thickness.

9. An apparatus as in claim 1, wherein said switch means has an independently changeable voltage so that modulating the gate decreases ON resistance of the transistor when the transistor is in the ON state.

10. An apparatus as in claim 4, wherein said first insulator layer includes two insulating members, said gate including two gate members respectively overlying said two insulating members.

11. An apparatus as in claim 4, wherein said source region and said drain region are made of a first conductivity type, said body region being made of a second conductivity type which is a different conductivity than said first conductivity type, said drain region being more heavily doped than said body region, said substrate being made of said second conductivity type and is less heavily doped than said body region.

12. A method of changing an ON state resistance of a transistor independently and free of degrading a breakdown voltage of the transistor, comprising the steps of:
   detecting the ON state and the OFF state of the transistor;
   applying a voltage on a gate of the transistor to drive a draft region of the transistor into accumulation in response to the ON state being detected by the step of detecting; and
   making the gate float in response to the OFF state being detected by the step of detecting so as to thereby avoid degradation of the breakdown voltage.

13. The method as in claim 12, further comprising the step of modulating the voltage so as to change the ON state resistance of the transistor independently of breakdown voltage of said transistor.

* * * * *